United States Patent
Park

(10) Patent No.: US 7,894,281 B2
(45) Date of Patent: Feb. 22, 2011

(54) REDUNDANCY CIRCUIT USING COLUMN ADDRESSES

(75) Inventor: Kyoung-Wook Park, Ichon (KR)

(73) Assignee: Hynix Semiconductor Inc. (KR)

( * ) Notice: Subject to any disclaimer, the term of this patent is extended or adjusted under 35 U.S.C. 154(b) by 307 days.

(21) Appl. No.: 12/177,832

(22) Filed: Jul. 22, 2008

(65) Prior Publication Data

US 2009/0168570 A1    Jul. 2, 2009

(30) Foreign Application Priority Data

Dec. 27, 2007  (KR) .................. 10-2007-0138266

(51) Int. Cl.
*G11C 29/00*   (2006.01)

(52) U.S. Cl. ............... 365/200; 365/230.03; 365/225.7; 365/189.05

(58) Field of Classification Search ................. 365/200, 365/230.03, 189.05, 225.7
See application file for complete search history.

(56) References Cited

U.S. PATENT DOCUMENTS

| | | | |
|---|---|---|---|
| 5,511,028 A | 4/1996 | Nam | |
| 6,259,636 B1 * | 7/2001 | Fukuda et al. | 365/200 |
| 6,657,907 B2 | 12/2003 | Lee | |
| 6,865,123 B2 | 3/2005 | Lee | |
| 2003/0095455 A1 * | 5/2003 | Dono et al. | 365/200 |

FOREIGN PATENT DOCUMENTS

| | | |
|---|---|---|
| JP | 2004-335070 | 11/2004 |
| KR | 1020020019171 A | 3/2002 |
| KR | 1020020042900 A | 6/2002 |
| KR | 1020070093747 A | 9/2007 |

* cited by examiner

*Primary Examiner*—Huan Hoang
(74) *Attorney, Agent, or Firm*—Baker & McKenzie LLP

(57) ABSTRACT

A redundancy circuit includes an address redundancy circuit block that compares column address information of a defective memory cell and an external input column address and outputs a redundancy column activation signal, and an input/output (IO) redundancy circuit block that, in response to IO fuse information, which is information about a sub-block where a column line of the defective memory cell is arranged, and the redundancy column activation signal, controls whether or not to activate a global IO line connected to an IO pad of the sub-block.

27 Claims, 6 Drawing Sheets

REDUNDANCY CIRCUIT USING COLUMN ADDRESSES

CROSS REFERENCE TO RELATED APPLICATION

The present application claims priority under 35 U.S.C. 119(a)to Korean application number 10-2007-0138266, filed on Dec. 27, 2007, in the Korean Intellectual Property Office, which is incorporated by reference in its entirety as if set forth in full.

BACKGROUND

1. Technical Field

The embodiments described herein relate to a redundancy circuit, and in particular, to a redundancy circuit that is capable of improving repair efficiency.

2. Related Art

In general, if a semiconductor integrated circuit has several or even one defective memory cell, then it is determined as a defective circuit and cannot be placed on the market. This reduces yields and increases costs. Accordingly, a redundancy technology is used in conventional semiconductor integrated circuits, which replaces a defective memory cell with a reserve memory cell provided in advance in the semiconductor integrated circuit.

This redundancy technology may progress as follows: First, after a wafer manufacturing process is completed, a defective memory cell is detected by a test, and a fuse is cut for programming. Positional information of the defective memory cell, that is, a fuse-cut row or column address, is stored as preparation for replacing the defective memory cell with a redundancy memory cell.

A memory block in a conventional semiconductor integrated circuit may include multiple column lines, which use different input/output (hereinafter, referred to as "IO") paths (or IO lines) with the same column address, such that multiple bits can be simultaneously input/output. That is, multiple column lines may correspond to the same column address of the memory block. IO pins or IO pads are connected to multiple column lines. Accordingly, if any one of the memory cells connected to the column lines is defective, then all memory cells related to the column lines may be replaced with redundancy memory cells connected to redundancy column lines.

Furthermore, if any one column address in the memory block is defective, all of the IO lines connected to multiple column lines corresponding to the defective column address are subject to a redundancy scheme. Accordingly, repair efficiency and flexibility may be reduced.

SUMMARY

A redundancy circuit that can improve repair efficiency through the use of column addresses is described herein.

According to one aspect, a redundancy circuit includes an address redundancy circuit block that compares column address information of a defective memory cell and an external input column address and outputs a redundancy column activation signal, and an input/output (IO) redundancy circuit block coupled with the address redundancy circuit block, the IO redundancy circuit block configured to control whether the activation of a global IO line connected to an IO pad of a sub-block in response to IO fuse information including information related to the sub-block in which a column line of the defective memory cell is arranged and the redundancy column activation signal.

According to another aspect, a redundancy circuit includes an address redundancy circuit block configured to determine whether column address information of a defective memory cell and an external input column address are consistent with each other, and selectively provides a normal address path and a redundancy address path, and an IO redundancy circuit block coupled with the address redundancy circuit block, the IO redundancy circuit configured to determine whether to provide IO fuse information, which is information about a sub-block where a column line of the defective memory cell is arranged, in response to an output result of the address redundancy circuit block, and selectively activate a normal global line and a global redundancy line of the sub-block.

According to still another aspect, a redundancy circuit includes an address redundancy circuit block that compares column address information of a defective memory cell and an external input column address and outputs a redundancy column activation signal, and an IO redundancy circuit block that is controlled by the redundancy column activation signal to control, on the basis of IO fuse information, which is information about a sub-block where a column line of the defective memory cell is arranged, a path of a signal to be transmitted to an IO pad connected to a column line in the sub-block.

The IO redundancy circuit block includes an IO redundancy control section that, in response to the redundancy column activation signal, the IO fuse information as redundancy address and sub-block information, an IO decoder that decodes the redundancy address and sub-block information, and provides an activated global redundancy line, and a global redundancy line controller that, according to the activated global redundancy line, activates a specific write global redundancy line and a specific read global redundancy line.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

In the embodiments described herein, column address information and IO fuse information related to sub-blocks can be provided distinctly from each other, thereby improving repair efficiency. That is, since an IO fuse set is provided, in addition to a column address fuse set, information about a sub-block where a repaired column line is arranged can be acquired, and by using the information, repair efficiency and flexibility can be improved.

Figure 1:
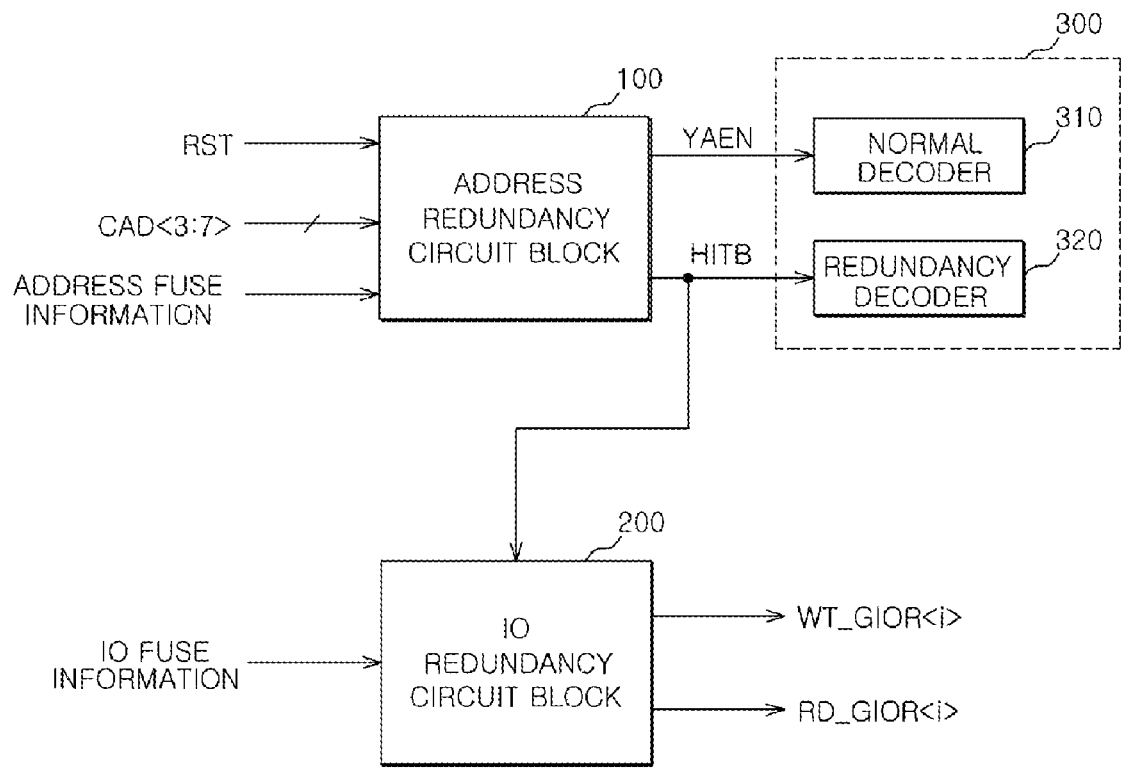
FIG. 1 is a conceptual block diagram of a semiconductor integrated circuit according to one embodiment.

FIG. 1 is a diagram illustrating a semiconductor integrated circuit 101 configured in accordance with one embodiment. Referring to FIG. 1, the semiconductor integrated circuit 101 can include an address redundancy circuit block 100, an IO redundancy circuit block 200, and a memory core 300.

In this example embodiment, the address redundancy circuit block 100 can be configured to use a column address. For example, the address redundancy circuit block 100 can be configured to selectively provide an address path according to whether or not address information of a defective memory cell and an external input address are consistent with each other. That is, the address redundancy circuit block 100 can be configured to compare the address information of the defective memory cell and the external input address, and if both are not consistent with each other, then provide a normal address path. Meanwhile, if the address information of the defective memory cell and the external input address are consistent with each other, then the address redundancy circuit block 100 can be configured to provide a redundancy address path.

The address redundancy circuit block 100 can be further configured to output a column address activation signal 'YAEN' and a redundancy column activation signal 'HITB' in response to a reset signal 'RST', column address signals 'CAD<3:7>', and address fuse information. In such an embodiment, the column address signals 'CAD<3:7>' can be used as the external input address, but the number of address bits can be changed according to the requirements of a particular implementation.

In the embodiment of FIG. 1, in addition of a column address fuse set (not shown), which can be configured to provide the address fuse information, and an IO fuse set (not shown), which can be configured to provide IO fuse information, can also be provided. Accordingly, the IO redundancy circuit block 200 can control, in response to IO fuse information related to the position of a column line of a defective memory cell and defective column address information, whether or not to activate a global line of the corresponding block.

Specifically, the IO redundancy circuit block 200 can activate a single write global redundancy line WT_GIOR<i> and a single read global redundancy line RD_GIOR<i> in response to IO fuse information, which is information about a sub-block where the column line of the defective memory cell is arranged, and the redundancy column activation signal 'HITB'. In this case, it is assumed that the write global line and the read global line are provided separately from each other in the semiconductor integrated circuit 101, but this doesn't necessarily need to be the case.

The memory core 300 can include a normal decoder 310 and a redundancy decoder 320. If the comparison result of the address fuse information and the column address signals 'CAD<3:7>' is false, then the corresponding cell is a defect-free normal cell. Accordingly, the normal decoder 310 can be driven in response to the column address activation signal 'YAEN'. However, if the comparison result of the address fuse information and the column address signals 'CAD<3: 7>' is true, then the corresponding cell is a defective cell, and thus the redundancy decoder 320 can be driven in response to the redundancy column activation signal 'HITB'. Then, while the normal address path is blocked, the redundancy address path is provided.

Figure 2:
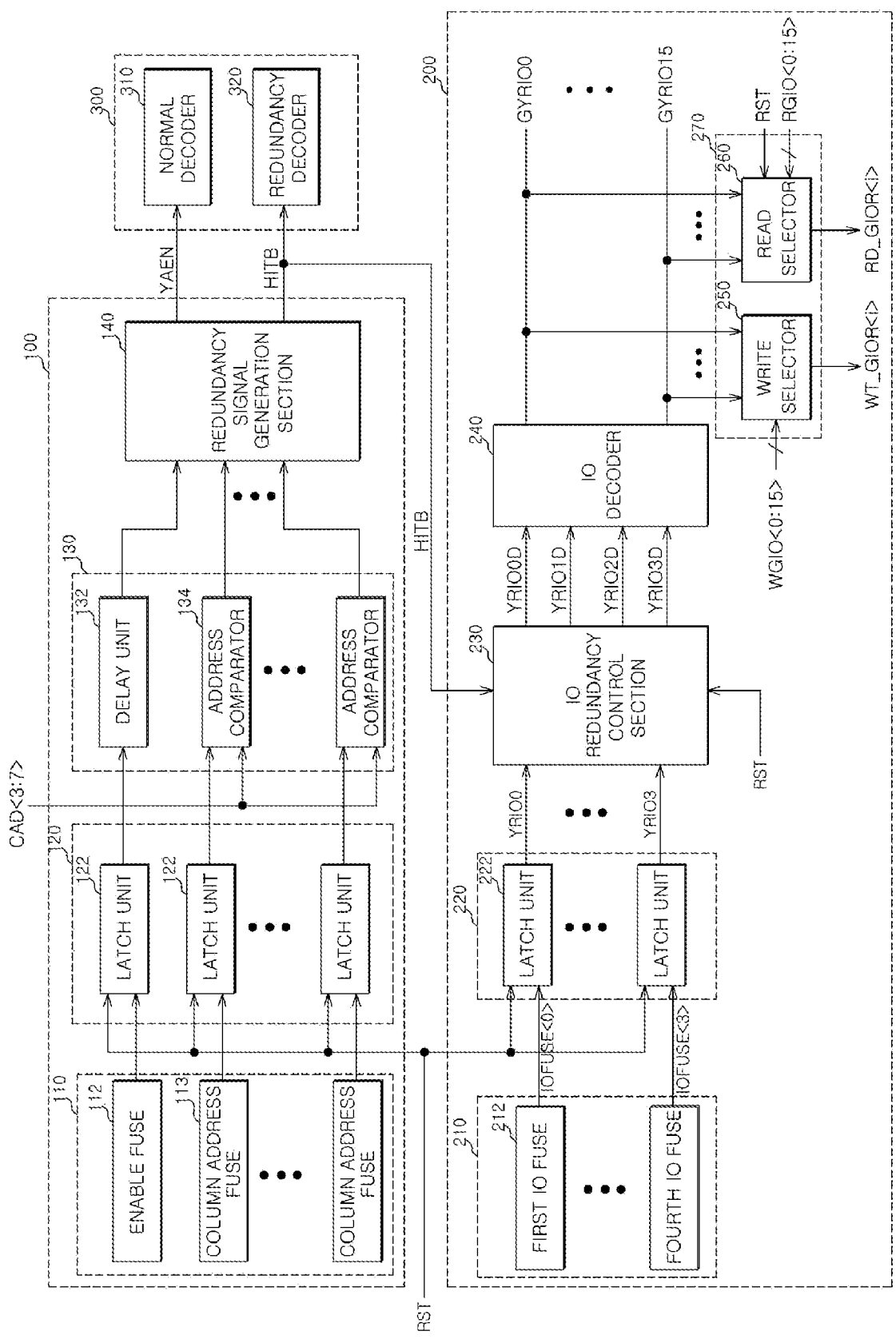
FIG. 2 is a detailed block diagram of the circuit of FIG. 1.

FIG. 2 is a detailed block diagram of FIG. 1. Referring to FIG. 2, the address redundancy circuit block 100 can include an address fuse section 110, an address fuse information latch section 120, a redundancy determining section 130, and a redundancy signal generation section 140.

The address fuse section 110 can in turn include an enable fuse 112 and a plurality of column address fuses 113.

The enable fuse 112 can be a general master fuse, and can be configured to output a master signal (not shown) for enabling the column address fuses 113. When a memory cell is repaired, the enable fuse 112 can be cut to output an activated master signal. Each of the column address fuses 113 can be configured to receive and store a cut fuse address of a defective memory cell. That is, the column address fuse 113 can be configured to store the column address of the repaired memory cell.

The address fuse information latch section 120 can include a plurality of latch units 122, which can be configured to latch the reset signal 'RST' and signals output from the address fuse section 110. Here, the reset signal 'RST' can be deactivated at a high level when a power supply voltage supplied from the semiconductor integrated circuit 101 is higher than a predetermined level. Accordingly, during normal operation of the semiconductor integrated circuit 101, the reset signal 'RST' can be at a high level.

The redundancy determining section 130 can be configured to receive the latched fuse information and the external column address signals 'CAD<3:7>', and to determine whether or not they are consistent with the stored fused address. The redundancy determining section 130 can include a delay unit 132 and a plurality of address comparators 134 corresponding to a plurality of column address signals 'CAD<3:7>'.

The delay unit 132 can be configured to delay an enable fuse information signal for a predetermined time. The predetermined time can be that needed for an address signal to be provided as a valid address signal. The address comparators 134 can be configured to compare the column address signals 'CAD<3:7>' and output signals from the address fuse information latch section 120, respectively. If the comparison result in each of the address comparators 134 is true, then a high-level signal can be output.

The redundancy signal generation section 140 can be configured to selectively provide the normal address path and the redundancy address path according to the results of the individual address comparators 134. That is, if the comparison results in the individual address comparators 134 are all true, then the redundancy column activation signal 'HITB' can be activated, e.g., at a low level, and simultaneously the column address activation signal 'YAEN' can be deactivated, e.g., at a low level. If any one of the comparison results in the individual address comparators 134 is false, then the redundancy column activation signal 'HITB' deactivated at a high level can be output, and simultaneously the column address activation signal 'YAEN' activated at a high level can be output.

The IO redundancy circuit block 200 can include an IO fuse section 210, an IO fuse information latch section 220, an IO redundancy control section 230, an IO decoder 240, and a global redundancy line controller 270.

The IO fuse section 210 can include a plurality of IO fuses 212. The number of IO pads and the number of IO fuses have a relationship of $2^n$. For example, if the number of IO pads is 4, then two IO fuses 212 are provided, if the number of IO pads is 8, then three IO fuses 212 are provided, and if the number of IO pads is 16, then four IO fuses 212 are provided. Each of the IO fuses 212 can be set at a low level when being cut, and at a high level when not cut. A combination of information about whether the IO fuses 212 are cut represents positional information of a memory sub-block where a repaired column line is arranged.

The fuses can be cut via, e.g., a method that cuts a fuse by an overcurrent, a method that cuts a fuse by a laser beam, and a method that short-circuits a junction by a laser beam.

The relationship between the IO pad and the sub-block according to the IO fuses 212 is as shown in Table 1. In the embodiments described herein, the semiconductor integrated circuit 101 has 16 IO pads, but for convenience of explanation, in Table 1, the number of IO pads is 4.

TABLE 1

| First IO Fuse | Second IO Fuse | Sub-Block | IO Pad |
|---|---|---|---|
| L | L | First Sub-Block | IO 0 |
| L | H | Second Sub-Block | IO 1 |
| H | L | Third Sub-Block | IO 2 |
| H | H | Fourth Sub-Block | IO 3 |

Referring to Table 1, the four IO pads are correspondingly connected to the sub-blocks. As described above, a plurality of column lines corresponding to a defective column address are arranged one for each sub-block, and a single IO pad corresponds to each sub-block. Accordingly, in a conventional device, if a redundancy scheme is applied to the column lines corresponding to the column address, the column lines of the individual sub-blocks are to be repaired. Therefore, the redundancy scheme should be applied to all of the IO pads correspondingly connected to the sub-blocks.

In contrast, according to the embodiments described herein, since the IO redundancy circuit block 200 is provided, what is necessary is to store, in the IO fuse 212, information about the sub-block that includes the column line of the defective memory cell, and to control the path of the global IO line to the IO pad of the corresponding block using the information. This will be described below in detail.

The IO fuse information latch section 220 will now be described. The IO fuse information latch section 220 can be configured to latch information that is provided from the IO fuse section 210. The IO fuse information latch section 220 can include a plurality of latch units 222. The latch units 222 correspondingly receive the output signals of the IO fuse section 210 and the reset signal 'RST', and can provide first to fourth sub-block information signals 'YRIO0' to 'YRIO3', respectively.

The IO redundancy control section 230 can be configured to provide first to fourth redundancy address and sub-block information signals 'YRIO0D' to 'YRIO3D' in response to the first to fourth sub-block information 'YRIO0' to 'YRIO3' and the redundancy column activation signal 'HITB'. That is, the first to fourth redundancy address and sub-block information signals 'YRIO0D' to 'YRIO3D' are signals containing a repair address as the positional information of the defective memory cell and the information about the corresponding sub-block. The IO redundancy control section 230 can receive the reset signal 'RST' and can be set to have an initial value according to the reset signal 'RST' when the semiconductor integrated circuit 101 is initialized.

The IO decoder 240 can be configured to receive the four redundancy address and sub-block information signals 'YRIO0D' to 'YRIO3D', and to generate 16 global redundancy line signals 'GYRIO<0:15>'. The IO decoder 240 can be a general decoder that receives n input signals and outputs $2^n$ output signals. For example, a global redundancy line signal activated at a high level among the 16 global redundancy line signals 'GYRIO<0:15>' can be provided. Accordingly, what is necessary is to apply redundancy logic to an IO pad in a specific sub-block in response to the activated output signal of the IO decoder 240, instead of a normal global IO line.

Thus, the global redundancy line controller 270 can include a write selector 250 and a read selector 260. As described above, a read global line and a write global line can be provided separately from each other, and thus the global lines can be controlled for each case.

First, when a write command is activated, the write selector 250 can replace one of the received write global line signals 'WGIO<0:15>' with a write global redundancy line signal 'WT_GIOR<i>' according to the activated global redundancy line signal 'GYRIO<i>' among the global redundancy line signals 'GYRIO<0:15>'.

When a read command is activated, the read selector 260 can provide, based on the activated global redundancy line signal 'GYRIO<i>', the read global redundancy line signal 'RD_GIOR<i>', which can be activated at a high level and is connected thereto. In particular, the read selector 260 can have control logic different from the write selector 250. This will be described below with reference to FIGS. 5 and 6.

Figure 3:
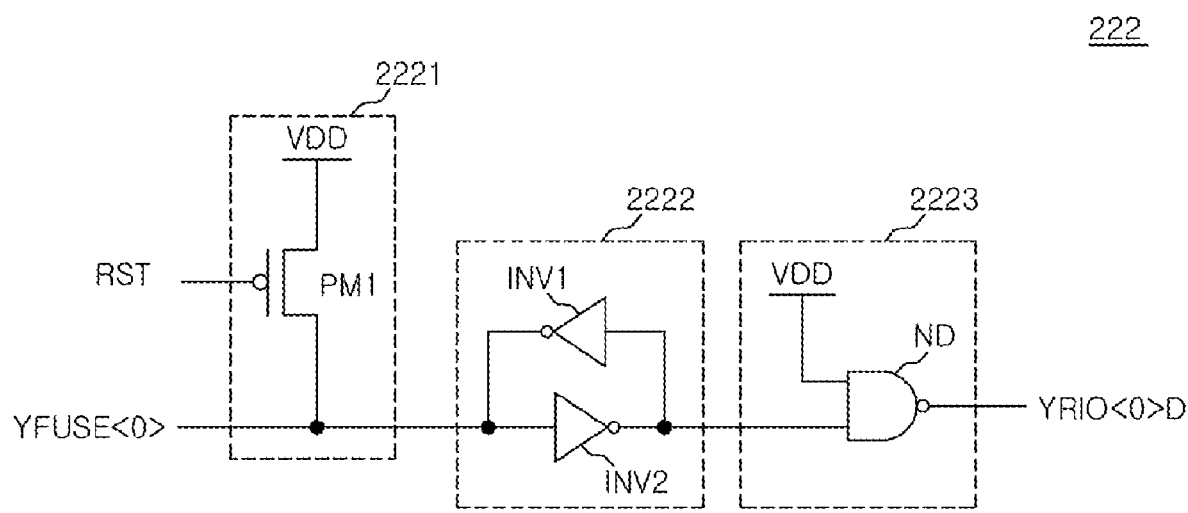
FIG. 3 is a circuit diagram of a latch unit that can be included in the circuit shown in FIG. 2.

FIG. 3 is a detailed circuit diagram of a latch unit 222 in the IO fuse information latch section 220 of FIG. 2. Referring to FIG. 3, the latch unit 222 can include an initializer 2221, a latch 2222, and an inversion unit 2223.

The initializer 2221 can be configured to initialize the latch unit 222 by the reset signal 'RST' during the initial operation of the semiconductor integrated circuit 101. The initializer 2221 can include a first PMOS transistor PM1 configured to receive the reset signal 'RST'. The first PMOS transistor PM1 can have a gate, to which the reset signal 'RST' is input, a drain, to which first IO fuse information signal 'YFUSE<0>' is input, and a source, to which an external power supply voltage VDD is applied.

The latch 2222 can be configured to invert and latch the received first IO fuse information signal 'YFUSE<0>'. The latch 2222 can include first and second inverters INV1 and INV2 connected with each other in a latch type configuration.

The inversion unit 2223 can be configured to invert the output signal of the latch 2222. The inversion unit 2223 can includes a NAND gate ND. The NAND gate ND can have one input terminal, to which the output signal of the latch 2222 is input, and another input terminal, to which the external power supply voltage VDD is input.

The operation of the latch unit 222 will now be described. During the initial operation of the semiconductor integrated circuit 101, the reset signal 'RST', which can be at the low level, is received, the first PMOS transistor PM1 is turned-on, and the first sub-block information signal 'YRIO<0>' is initialized at a high level. Subsequently, the reset signal 'RST' can transition to a high level. In which case, the received first IO fuse information signal 'YFUSE<0>' is latched and provided as the first sub-block information signal 'YRIO<0>'.

Figure 4A:
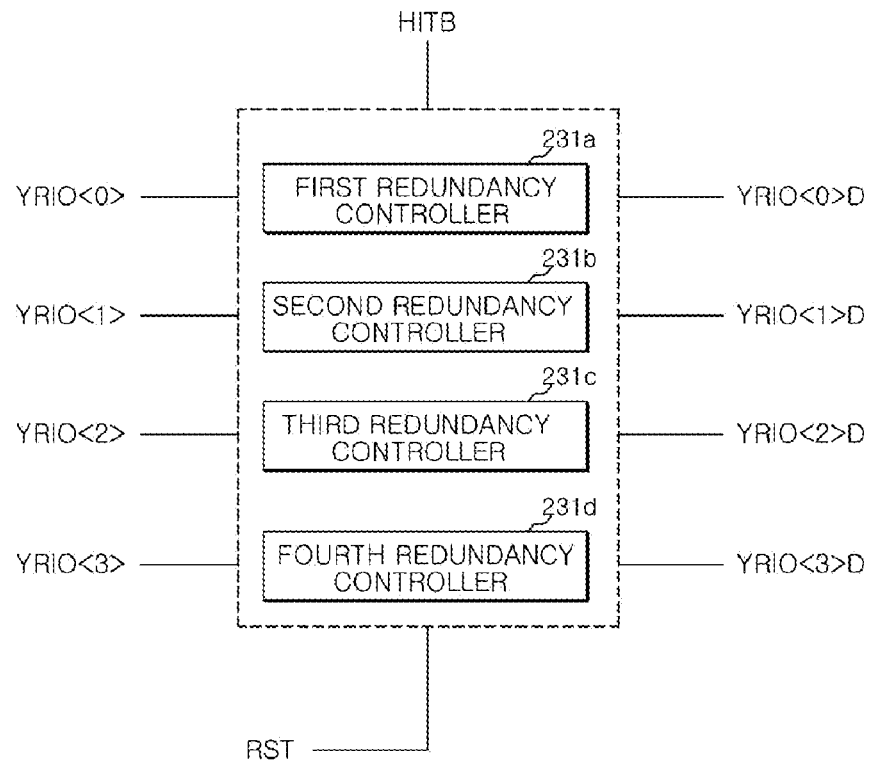
FIG. 4A is a block diagram of an IO redundancy control section that can be included in the circuit shown in FIG. 2.

FIG. 4A is a block diagram of the IO redundancy control section 230 shown in FIG. 2. he IO redundancy control section 230 can include first to fourth redundancy controllers 231a to 231d corresponding to the first to fourth sub-block information signals 'YRIO<0:3>'. If the redundancy column activation signal 'HITB' is received, then the first to fourth sub-block information signals 'YRIO<0:3>' can be provided as valid first to fourth redundancy address and sub-block information signals 'YRIO<0:3>D'.

Figure 4B:
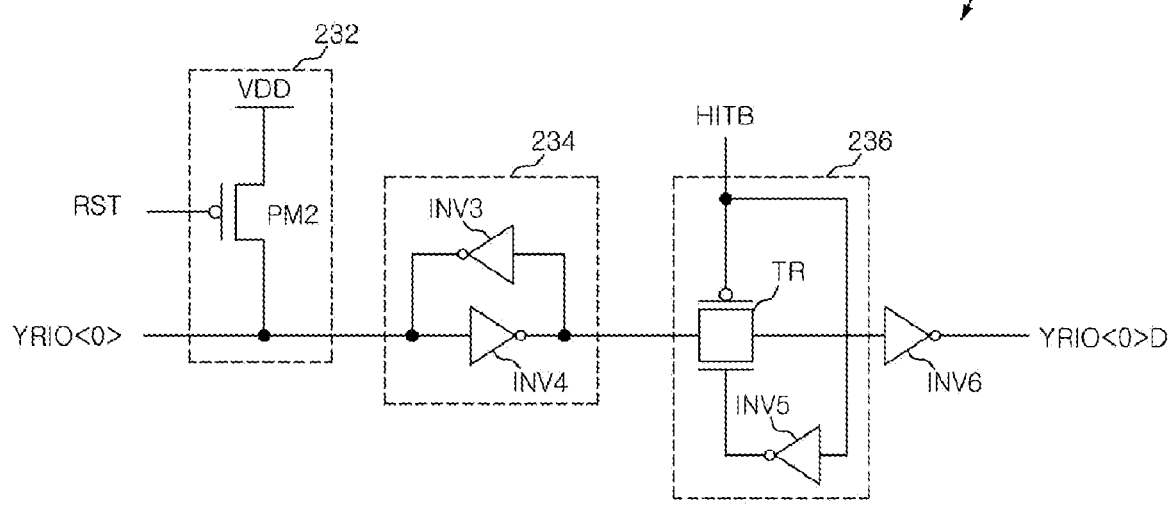
FIG. 4B is a circuit diagram of a first redundancy controller that can be included in the IO redundancy control section shown in FIG. 4A.

FIG. 4B is a circuit diagram of the first redundancy controller 231a shown in FIG. 4A. For convenience of explanation, only the first redundancy controller 231a is shown, but the second to fourth redundancy controllers 231b to 231d can have the same configuration and operation principle as the first redundancy controller 231a.

It should be noted that the first redundancy controller 231a and the latch unit 222 operate similarly, but certain differences will be described in detail.

The first redundancy controller 231a can include an initializer 232, a latch 234, and a transmitter 236. The initializer 232 can be configured to initialize the IO redundancy control section 230 by the reset signal 'RST' during the initial operation of the semiconductor integrated circuit 101. The initializer 232 can include a second PMOS transistor PM2.

The latch 234 can be configured to invert and latch the received first sub-block information signal 'YRIO<0>'. The latch 234 can include third and fourth inverters INV3 and INV4 that are connected with each other in a latch type configuration.

The transmitter 236 can include a pass gate TR and a fifth inverter INV5. The transmitter 236 can be configured to transmit a latched signal in response to the redundancy column activation signal 'HITB'.

The operation of the first redundancy controller 231a will now be described. First, a case where the address redundancy circuit block 100 generates the activated redundancy column activation signal 'HITB' is illustrated.

At this time, the redundancy column activation signal 'HITB', which can be at the low level, is received, and then the pass gate TR of the transmitter 236 is turned on. Then, the first redundancy address and sub-block information signal 'YRIO<0>D' is provided at the same level as the first sub-block information signal 'YRIO<0>'.

However, when the deactivated redundancy column activation signal 'HITB' is received from the address redundancy circuit block 100, the pass gate TR is turned off, and the first redundancy address and sub-block information signal 'YRIO<0>D' floats.

That is, only when the activated redundancy column activation signal 'HITB' is received, does the first redundancy controller 231a provide the first redundancy address and sub-block information signal 'YRIO<0>D', which is valid as information about a repaired sub-block. Similarly, in response to the activated redundancy column activation signal 'HITB', the second to fourth redundancy address and sub-block information signals 'YRIO<1:3>D' can be provided as the information of the repaired sub-block. Subsequently, the redundancy address and sub-block information can be decoded by the IO decoder (see reference numeral 240 in FIG. 2) and provided to a global redundancy line activated at a high level among the 16 global redundancy lines GYRIO<0:15>. The activated global redundancy line means that the redundancy scheme should be applied.

Figure 5:
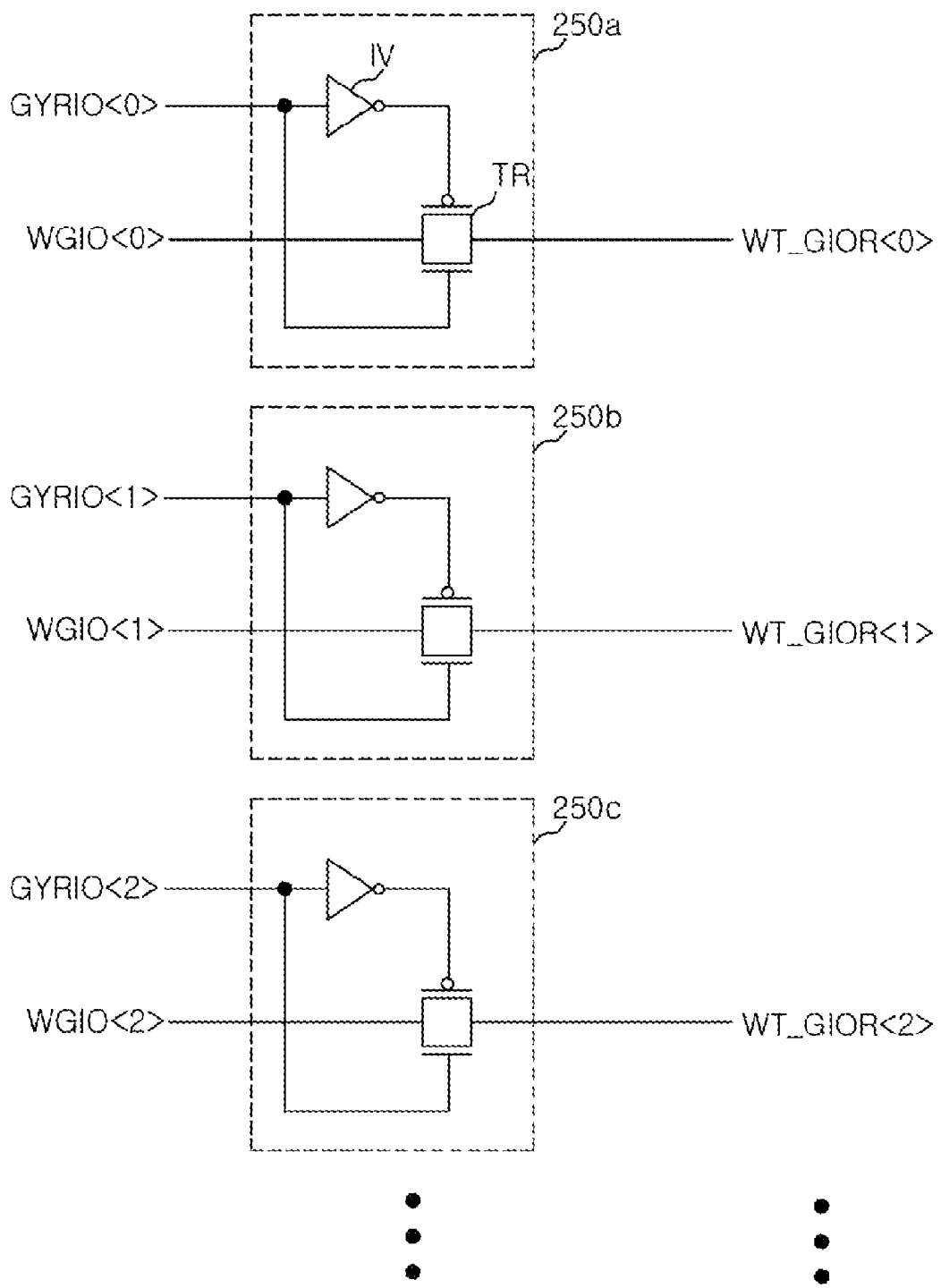
FIG. 5 is a circuit diagram of a write selector that can be included in the circuit shown in FIG. 2.

FIG. 5 is a circuit diagram of the write selector 250 shown in FIG. 2. Referring to FIG. 5, the write selector 250 can include first to n-th transmitters 250a, 250b, 250c, ... 250n that correspond to the first to 16-th global redundancy line signals 'GYRIO<0:15>'.

For convenience of explanation, the first transmitter 250a will be described. In the first transmitter 250a, the transmission of the first write global line signal 'WGIO<0>' is controlled by the first global redundancy line signal 'GYRIO<0>'. Here, a case where the first write global line signal 'WGIO<0>' is driven by an activated write command (not shown) is illustrated.

Specifically, the first transmitter 250a includes an inverter IV and a pass gate TR. The pass gate TR can be configured to transmit the first write global line signal 'WGIO<0>' to the write global redundancy line WT_GIOR<0> according to the activated first global redundancy line signal 'GYRIO<0>'. Specifically, when the first global redundancy line signal 'GYRIO<0>' is activated, e.g., at a high level, the pass gate TR is turned on, and the first write global line signal 'WGIO<0>' is replaced with the first write global redundancy line signal 'WT_GIOR<0>'.

Here, the first write global redundancy line signal 'WT_GIOR<0>' is illustrate, but any one write global redundancy line in the redundancy block (not shown) may be used.

Figure 6:
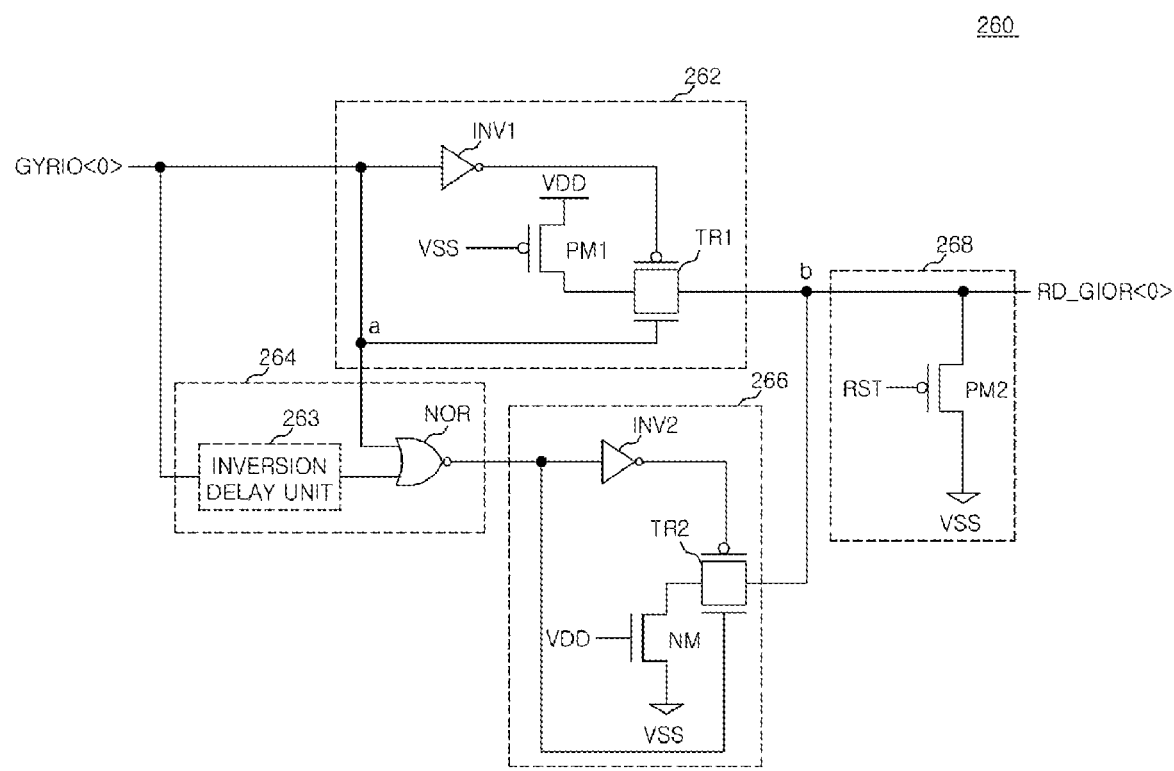
FIG. 6 is a circuit diagram of a read selector that can be included in the circuit shown in FIG. 2.

FIG. 6 is a circuit diagram of part of the read selector 260 shown in FIG. 2. For convenience of explanation, a circuit part that responds to the first global redundancy line signal 'GYRIO<0>' is illustrated, but the same can be applied to circuit parts that correspondingly response to other global redundancy line signals 'GYRIO<1:15>'.

Referring to FIG. 6, when the read global line is driven by the read command, the read selector 260 can replace the read global line with the first read global redundancy line RD_GIOR<0> according to the activated first global redundancy line signal 'GYRIO<0>'.

Unlike the write selector (see reference numeral 250 in FIG. 5), the read selector 260 can be configured to provide the corresponding read global redundancy line signal 'RD_GIOR<0>' according to the first global redundancy line signal 'GYRIO<0>', and after a predetermined time elapses, cause the read global redundancy line RD_GIOR<0> to be precharged.

Specifically, when writing, the global redundancy line signal 'GYRIO<i>', corresponding to the column information of the defective memory cell and the IO fuse information, is replaced with a specific write global redundancy line signal 'WT_GIOR<i>'.

Meanwhile, when reading, it is not known whether data is output from a repaired IO or not. That is, when reading, since the read operation is performed in any bank, information about a sub-block of each bank needs to be compared with information about a sub-block to be repaired. Accordingly, it is necessary to perform comparison of information about the global redundancy line for each sub-block, and to update information about the activated read global redundancy line for comparison with the sub-blocks of other banks.

The read selector 260 can include a transmitter 262, a pulse generator 264, a precharge unit 266, and an initializer 268.

The transmitter 262 can selectively provide a redundancy global line having the column information of the defective memory cell and the IO fuse information. The transmitter 262 can include a first inverter INV1, a first PMOS transistor PM1, and a first pass gate TR1. The first PMOS transistor PM1 can include a source, to which the external power supply voltage VDD is applied, a gate, to which a ground voltage VSS is applied and a drain connected to the first pass gate TR1. Then, if the first global redundancy line signal 'GYRIO<0>' is activated, then the first pass gate TR1 is turned on, and thus the read global redundancy line signal 'RD_GIOR<0>' is provided at the same level as the external power supply voltage VDD is provided.

The pulse generator 264 can internally generate a pulse signal according to the first global redundancy line signal 'GYRIO<0>'. The pulse generator 264 signal include an inversion delay unit 263 and a NOR gate NOR. Though not shown, the inversion delay unit 263 can include an odd number of inverters. The NOR gate NOR can receive a signal on a node (a), and an output signal of the inversion delay unit 263, and perform a NOR operation.

The precharge unit 266 can include a second inverter INV2, a second pass gate TR2, and an NMOS transistor NM. The NMOS transistor NM can includes a source, to which the ground voltage VSS is applied, a gate, to which the external power supply voltage VDD is applied, and a drain connected to the second pass gate TR2. The precharge unit 266 can precharge a signal on a node (b) in the high-level period of the pulse signal generated by the pulse generator 264.

The initializer 268 can initialize the read global redundancy line RD_GIOR<0> at a low level when the semiconductor integrated circuit 101 is initialized. The initializer 268 can include a second PMOS transistor PM2.

The operation of the read selector 260 will now be described. First, when the first global redundancy line signal 'GYRIO<0>' is activated, since the first global redundancy line signal 'GYRIO<0>' means a column address to be repaired and IO information (or sub-block information), the read operation can be performed using the read global redundancy line RD_GIOR<i>. Accordingly, the first pass gate TR1 can be turned on according to the activated first global redundancy line signal 'GYRIO<0>', and thus the first read global redundancy line signal 'RD_GIOR<0>' can be provided at the high level. For the comparison operation for each bank, however, the first read global redundancy line signal 'RD_GIOR<0>' should be initialized after a predetermined time elapses.

After the predetermined time elapses, the pulse generator 264 can generate a pulse. The precharge unit 266 can output a low level to the node (b) in response to the generated pulse. Then, the first read global redundancy line RD_GIOR<0> can be precharged again to a low level.

If the first global redundancy line signal 'GYRIO<0>' is deactivated, e.g., at a low level, then the transmitter 262 does not operate. In addition, since the pulse generator 264 does not generate a pulse at the fixed low level, the precharge unit 266 is turned off, and the node (b) floats.

As described above, during the read operation, if a cell is not defective, the read global redundancy line is put in a floating state. Meanwhile, when a defective cell exists, and the defective column address and the IO fuse information are consistent with each other, the read operation is performed using any read global line.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. A redundancy circuit, comprising:
    an address redundancy circuit block configured to compare column address information of a defective memory cell and an external input column address and output a redundancy column activation signal; and
    an input/output (IO) redundancy circuit block coupled with the address redundancy circuit block, the IO redundancy circuit block configured to control whether to activate a global IO line connected to an IO pad of a sub-block in response to IO fuse information including information related to the sub-block in which a column line of the defective memory cell is arranged and the redundancy column activation signal,
    wherein the IO redundancy circuit block comprises:
        an IO redundancy control section configured to use the IO fuse information as redundancy address and sub-block information in response to the redundancy column activation signal;
        an IO decoder coupled with the IO redundancy control section, the IO decoder configured to decode the redundancy address and sub-block information and activate a global redundancy line; and
        a global redundancy line controller coupled with the IO decoder, the global redundancy line controller configured to activate a specific write global redundancy line and a specific read global redundancy line according to the activated global redundancy line.

2. The redundancy circuit of claim 1, wherein the IO redundancy control section is further configured to provide the redundancy address and sub-block information at the same signal level as the IO fuse information when the redundancy column activation signal is activated.

3. The redundancy circuit of claim 1, wherein the IO redundancy control section is further configured to put the redundancy address and sub-block information in a floating state when receiving an activated redundancy column activation signal.

4. The redundancy circuit of claim 1, wherein the global redundancy line controller comprises:
    a write selector configured to replace one of a plurality of write global lines with the write global redundancy line according to the activated global redundancy line when a write command is activated; and
    a read selector configured to control whether to activate the read global redundancy line correspondingly connected to the global redundancy line when a read command is activated.

5. The redundancy circuit of claim 4, wherein the write selector includes a transmitter that is activated according to the global redundancy line and configured to transmit to the write global line.

6. The redundancy circuit of claim 4, wherein the read selector comprises:
    a transmitter configured to provide the read global redundancy line activated at a high level according to the activated global redundancy line;
    a pulse generator configured to generate a pulse after a predetermined time elapses according to the activated global redundancy line; and
    a precharge unit configured to precharge an output node of the transmitter to a low level in response to the pulse.

7. The redundancy circuit of claim 6, wherein the precharge unit includes:
    a pass gate that is turned on during a high-level period of the pulse; and
    an NMOS transistor that is connected to the pass gate and is turned on by an external power supply voltage to synchronize the output node with a ground voltage.

8. The redundancy circuit of claim 6, wherein the read selector is further configured to put the read global redundancy line in a floating state when a corresponding global redundancy line is deactivated.

9. A redundancy circuit, comprising:
    an address redundancy circuit block configured to determine whether column address information of a defective memory cell and an external input column address are consistent with each other, and to selectively provide a normal address path and a redundancy address path; and an IO redundancy circuit block coupled with the address redundancy circuit block, the IO redundancy circuit configured to determine whether to provide IO fuse information, which is information about a sub-block where a column line of the defective memory cell is arranged, in response to an output result of the address redundancy circuit block, and selectively activate a normal global line and a global redundancy line of the sub-block, wherein the IO redundancy circuit block includes:

an IO redundancy control section configured to provide the IO fuse information as redundancy address and sub-block information in response to a redundancy column activation signal, which is an output signal of the address redundancy circuit block;

an IO decoder coupled with the IO redundancy control section, IO decoder configured to decode the redundancy address and sub-block information, and provide an activated global redundancy line; and a global redundancy line controller coupled with the IO decoder, the global redundancy line controller configured to activate a specific write global redundancy line and a specific read global redundancy line according to the activated global redundancy line.

10. The redundancy circuit of claim 9, wherein the IO redundancy control section is further configured to provide the redundancy address and sub-block information at the same signal level as the IO fuse information when receiving an activated redundancy column activation signal.

11. The redundancy circuit of claim 9, wherein the IO redundancy control section is further configured to put the redundancy address and sub-block information in a floating state when receiving a deactivated redundancy column activation signal.

12. The redundancy circuit of claim 9, wherein the global redundancy line controller comprises:

a write selector configured to replace one of write global lines with the write global redundancy line according to the activated global redundancy line when a write command is activated; and a read selector configured to control whether to activate the read global redundancy line correspondingly connected to the global redundancy line when a read command is activated.

13. The redundancy circuit of claim 12, wherein the write selector includes a transmitter that is activated according to the global redundancy line and configured to transmit to the write global line.

14. The redundancy circuit of claim 12, wherein the read selector includes:

a transmitter configured to provide a read global redundancy line activated at a high level according to the activated global redundancy line;

a pulse generator configured to generate a pulse after a predetermined time elapses according to the activated global redundancy line; and a precharge unit configured to precharge an output node of the transmitter to a low level in response to the pulse.

15. The redundancy circuit of claim 14, wherein the precharge unit includes:

a pass gate that is turned on during a high-level period of the pulse; and an NMOS transistor that is connected to the pass gate and is turned on by an external power supply voltage to synchronize the output node with a ground voltage.

16. The redundancy circuit of claim 14, wherein the read selector is configured to put the read global redundancy line in a floating state according to a deactivated global redundancy line.

17. A redundancy circuit, comprising:

an address redundancy circuit block configured to compare column address information of a defective memory cell and an external input column address and output a redundancy column activation signal; and an IO redundancy circuit block coupled with the address redundancy circuit block, the IO redundancy circuit block being controlled by the redundancy column activation signal to control, on the basis of IO fuse information, which is information about a sub-block where a column line of the defective memory cell is arranged, a path of a signal to be transmitted to an IO pad connected to a column line in the sub-block, the IO redundancy circuit block comprising:

an IO redundancy control section configured to use the IO fuse information as redundancy address and sub-block information in response to the redundancy column activation signal;

an IO decoder coupled with the IO redundancy control section, the IO decoder configured to decode the redundancy address and sub-block information, and provide to activate global redundancy line; and a global redundancy line controller coupled with the IO decoder, the global redundancy line controller configured to activate a specific write global redundancy line and a specific read global redundancy line according to the activated global redundancy line.

18. The redundancy circuit of claim 17, wherein the IO redundancy control section is further configured to provide the redundancy address and sub-block information at the same signal level as the IO fuse information when an activated redundancy column activation signal is received, and float the redundancy address and sub-block information when a deactivated redundancy column activation signal is received.

19. The redundancy circuit of claim 17, wherein the global redundancy line controller comprises:

a write selector configured to replace one of write global lines with the write global redundancy line according to the activated global redundancy line when a write command is activated; and a read selector configured to control whether or not to activate the read global redundancy line correspondingly connected to the global redundancy line when a read command is activated.

20. The redundancy circuit of claim 19, wherein the write selector includes a transmitter that is activated according to the global redundancy line and configured to transmit to the write global line.

21. The redundancy circuit of claim 19, wherein the read selector includes:

a transmitter configured to provide a read global redundancy line activated at a high level according to the activated global redundancy line;

a pulse generator configured to generate a pulse after a predetermined time elapses according to the activated global redundancy line; and a precharge unit configured to precharge an output node of the transmitter to a low level in response to the pulse.

22. The redundancy circuit of claim 21, wherein the precharge unit comprises:

a pass gate that is turned on during a high-level period of the pulse; and an NMOS transistor that is connected to the pass gate and is turned on with an external power supply voltage to synchronize the output node with a ground voltage.

23. The redundancy circuit of claim 21, wherein the read selector is further configured to put the read global redundancy line in a floating state according to a deactivated global redundancy line.

24. A redundancy circuit, comprising:

an IO redundancy control section configured to use IO fuse information as redundancy address and sub-block information in response to a redundancy column activation signal when a defective memory cell is occurred;

an IO decoder coupled with the IO redundancy control section, the IO decoder configured to decode the redundancy address and sub-block information and activate a global redundancy line;

a write selector configured to replace one of a plurality of write global lines with a write global redundancy line according to the activated global redundancy line when a write command is activated; and a read selector configured to control whether to activate a read global redundancy line correspondingly connected to the global redundancy line when a read command is activated.

25. The redundancy circuit of claim 24, wherein the write selector includes a transmitter that is activated according to the global redundancy line and configured to transmit to the write global line.

26. The redundancy circuit of claim 24, wherein the read selector comprises:

a transmitter configured to provide the read global redundancy line activated at a high level according to the activated global redundancy line;

a pulse generator configured to generate a pulse after a predetermined time elapses according to the activated global redundancy line; and a precharge unit configured to precharge an output node of the transmitter to a low level in response to the pulse.

27. The redundancy circuit of claim 24, wherein the read selector is further configured to put the read global redundancy line in a floating state when a corresponding global redundancy line is deactivated.

* * * * *